United States Patent
Fang

(10) Patent No.: US 11,450,122 B2
(45) Date of Patent: Sep. 20, 2022

(54) METHODS AND SYSTEMS FOR DEFECT INSPECTION AND REVIEW

(71) Applicant: ASML Netherlands B.V., Veldhoven (NL)

(72) Inventor: Wei Fang, Milpitas, CA (US)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 16/959,415

(22) PCT Filed: Dec. 19, 2018

(86) PCT No.: PCT/EP2018/085808
§ 371 (c)(1),
(2) Date: Jun. 30, 2020

(87) PCT Pub. No.: WO2019/129569
PCT Pub. Date: Jul. 4, 2019

(65) Prior Publication Data
US 2020/0334446 A1 Oct. 22, 2020

Related U.S. Application Data

(60) Provisional application No. 62/612,599, filed on Dec. 31, 2017.

(51) Int. Cl.
*G06K 9/00* (2022.01)
*G06V 20/69* (2022.01)
*G01R 31/307* (2006.01)

(52) U.S. Cl.
CPC ......... *G06V 20/698* (2022.01); *G01R 31/307* (2013.01)

(58) Field of Classification Search
None
See application file for complete search history.

(56) References Cited

U.S. PATENT DOCUMENTS

| 8,139,843 B2 | 3/2012 | Kulkarni et al. |
| 9,710,903 B2 | 7/2017 | Fouquet et al. |

(Continued)

FOREIGN PATENT DOCUMENTS

| JP | 2014-239230 A | 12/2014 |
| TW | 200900684 A | 1/2009 |
| TW | 200945215 A | 11/2009 |

OTHER PUBLICATIONS

International Search Report and Written Opinion issues by the International Searching Authority in related PCT Application No. PCT/EP2018/085808, dated Feb. 14, 2019 (11 pgs.).

(Continued)

*Primary Examiner* — Soo Jin Park
(74) *Attorney, Agent, or Firm* — Finnegan, Henderson, Farabow, Garrett & Dunner, LLP

(57) ABSTRACT

Systems and methods for detecting defects are disclosed. According to certain embodiments, a method of performing image processing includes acquiring one or more images of a sample, performing first image analysis on the one or more images, identifying a plurality of first features in the one or more images, determining pattern data corresponding to the plurality of first features, selecting at least one of the plurality of first features based on the pattern data, and performing second image analysis of the at least one of the plurality of first features. Methods may also include determining defect probability of the plurality of first features based on the pattern data. Selecting the at least one of the plurality of first features may be based on the defect probability.

12 Claims, 8 Drawing Sheets

(56) References Cited

U.S. PATENT DOCUMENTS

| | | | |
|---|---|---|---|
| 10,190,991 B2* | 1/2019 | Sofer | G05B 19/41875 |
| 10,408,764 B2* | 9/2019 | Shabtay | G01N 21/8851 |
| 2016/0284579 A1* | 9/2016 | Kaizerman | H01L 22/12 |
| 2017/0345138 A1 | 11/2017 | Middlebrooks et al. | |

OTHER PUBLICATIONS

Chinese Office Action issued in a related Chinese Application No. 107147063, dated Jan. 21, 2020 (12 pgs.).

* cited by examiner

| Identified possible defect | Pattern data | Defect probability information | Group |
|---|---|---|---|
|  |  | A | 1 |
|  |  | B | 2 |
|  |  | C | 3 |
|  |  | D | 4 |
|  |  | E | 5 |
|  |  | F | 6 |
|  |  | G | 7 |
|  |  | H | 8 |
|  |  | I | 9 |
|  |  | J | 10 |
|  |  | K | 11 |
|  |  | L | 12 |

METHODS AND SYSTEMS FOR DEFECT INSPECTION AND REVIEW

CROSS-REFERENCE TO RELATED APPLICATIONS

This application is a national stage filing under 35 U.S.C. § 371 of International Application No. PCT/EP2018/085808, filed Dec. 19, 2018, and published as WO 2019/129569 A1, which claims priority of U.S. application 62/612,599 which was filed on Dec. 31, 2017. The contents of these applications are each incorporated herein by reference in their entireties.

FIELD

The description herein relates to the field of defect detection, and more particularly to inspection and review of defects on a sample.

BACKGROUND

In manufacturing processes of integrated circuits (ICs), unfinished or finished circuit components are inspected to ensure that they are manufactured according to design and are free of defects. Inspection systems utilizing optical microscopes or charged particle (e.g., electron) beam microscopes, such as a scanning electron microscope (SEM) can be employed. As the physical sizes of IC components continue to shrink, accuracy and yield in defect detection become more and more important. However, imaging resolution and throughput of inspection tools struggles to keep pace with the ever decreasing feature size of IC components.

When technology nodes are reduced down to, for example, 10 nm, some inspection tools may generate a large amount of nuisance defects (i.e., false positives). For example, in some inspection systems, 90% of identified defects may turn out to be nuisance defects. Therefore, defect review becomes increasingly critical. Defect review can be employed that involves reconfirmation of previously identified defects or suspect locations on a wafer.

In some inspection systems, for example, at a fab, an SEM review tool may be used to review defects. The tool may select a predetermined number of defects for review based on a sample selection rule. The sample selection rule may be a random sampling of the whole population of defects found on a wafer. However, among the identified defects, only a small portion of them may actually be real defects. Thus, the rate of real defect review becomes low, and may lead to misleading information being provided as a result of the review. Additionally, there may be a need to reselect new potential defects for review to ensure the proper amount of real defect review coverage. However, conducting repeated defect review is time consuming.

Thus, related art systems face limitations in, for example, accuracy and throughput in providing useful information concerning detected defects. Further improvements in the art are desired.

SUMMARY

Embodiments of the present disclosure provide systems and methods for defect detection. In some embodiments, a charged particle beam system is provided. The charged particle beam system may include a charged particle beam apparatus configured to generate a charged particle beam.

In some embodiments, a controller of a charged particle beam system is configured to implement a method of performing image processing, a method of inspecting a sample, or other methods. A method of performing image processing may include acquiring one or more images of a sample, performing first image analysis on the one or more images, identifying a plurality of first features in the one or more images, determining pattern data corresponding to the plurality of first features, selecting at least one of the plurality of first features based on the pattern data, and performing second image analysis of the at least one of the plurality of first features. Methods may also include determining defect probability of the plurality of first features based on the pattern data. Selecting the at least one of the plurality of first features may be based on the defect probability.

According to some embodiments, an arrangement can be achieved that can enhance defect detection in a charged particle beam system.

Additional objects and advantages of the disclosed embodiments will be set forth in part in the following description, and in part will be apparent from the description, or may be learned by practice of the embodiments. Objects and advantages of the disclosed embodiments may be realized and attained by the elements and combinations set forth in the claims. However, exemplary embodiments of the present disclosure are not necessarily required to achieve such exemplary objects and advantages, and some embodiments may not achieve any of the stated objects and advantages.

It is to be understood that both the foregoing general description and the following detailed description are exemplary and explanatory only and are not restrictive of the disclosed embodiments, as claimed.

DETAILED DESCRIPTION OF THE DRAWINGS

Figure 1:
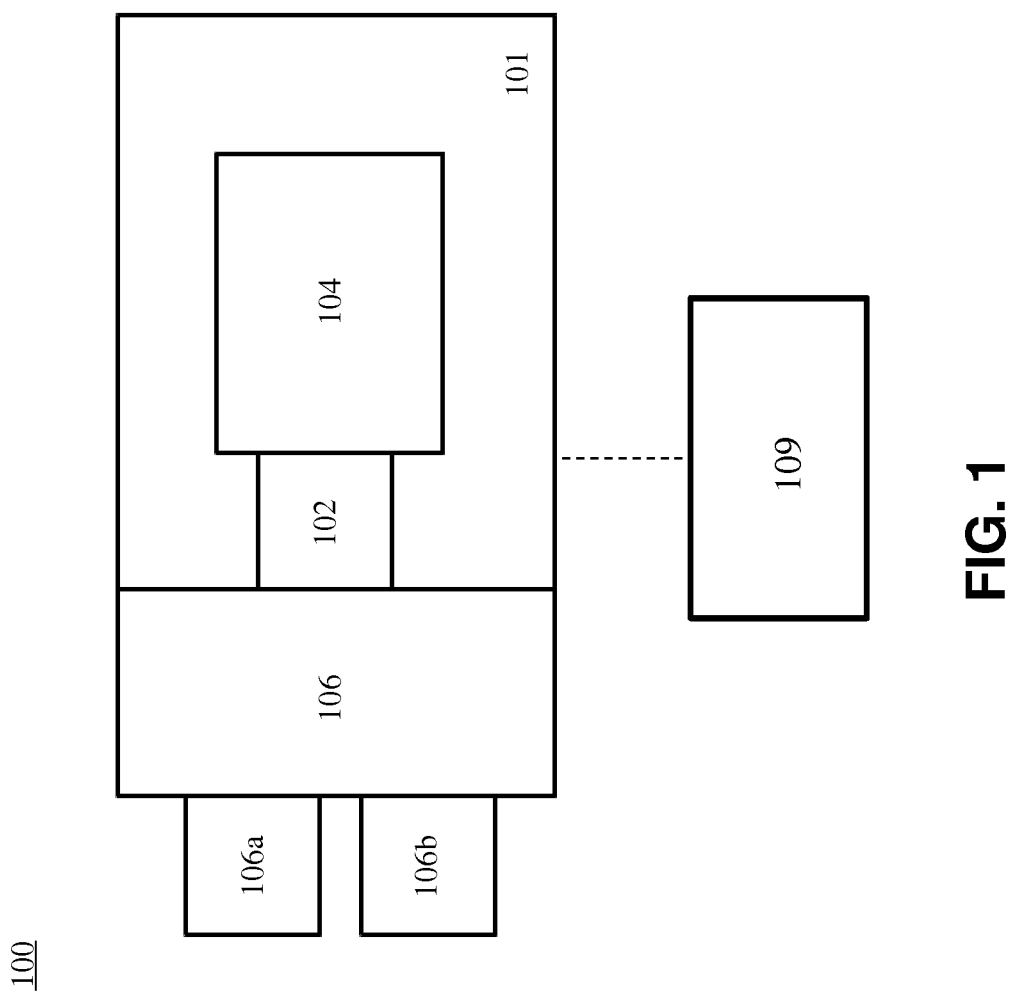
FIG. 1 is a schematic diagram illustrating an exemplary electron beam inspection (EBI) system, consistent with embodiments of the present disclosure.

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations consistent with the invention. Instead, they are merely examples of apparatuses, systems, and methods consistent with aspects related to the subject matter as recited in the appended claims. For example, although some embodiments are described in the context of utilizing electron beams, the disclosure is not so limited. Other types of charged particle beams can be similarly applied. Furthermore, other imaging systems can be used, such as optical imaging, photo detection, x-ray detection, etc.

Embodiments of the present disclosure may provide a charged particle system that may be useful for charged particle imaging. The charged particle system may be applicable as a scanning electron microscope (SEM) tool for imaging and inspecting a sample. The charged particle system can be used for defect detection.

A defect may refer to an abnormal condition at a component on a sample that may lead to a failure.

In some exemplary embodiments, a sampling method is provided to increase the real defect selection chance based on pattern grouping and pattern defect probability.

In an exemplary method, a first defect search may be performed. The first defect search may be an inspection step wherein an imaging tool checks for the presence or absence of defects on a wafer, and determines corresponding positions of defects. The first defect search may include searching for possible defects and storing a list of possible defect locations. Then, wafer pattern data can be extracted from a design plan based on the possible defect locations. Next, pattern grouping can be performed to group together patterns having similar structures. Grouping may be performed by clustering. A pattern library can be built based on the grouped patterns and their analyzed defect rate.

In particular, a first defect search may include performing image analysis on a captured image of a wafer surface using a first set of parameters and/or a first image processing algorithm. The image analysis may identify possible defects through the output of a defect scanning process (e.g., a klarf file, or other file that can register defect coordinates). Location data of identified possible defects can then be used to extract pattern data from the wafer design. For example, a wafer design plan may be stored in a database. The wafer design plan may be based on GDS (Graphic Data System) or OASIS (Open Artwork System Interchange Standard) designs, and the like. Pattern data such as shape, size, geometry, etc. of features in the wafer design can be extracted based on the possible defect location data. Based on the pattern data, the possible defects identified in the first defect search can be sorted into groups. For example, features having similar shape data may be grouped together on the basis of a level of correspondence with one another, or to a standard pattern.

Following the first defect search, defect review can be performed on the identified possible defects. Defect review may comprise analyzing and classifying defects found in preceding inspection. A predetermined number of the possible defects may be selected for review based on a sample selection rule. The sample selection rule may be a random sampling of the whole population of possible defects found on the wafer, or some other rule. For example, 200 defects may be randomly selected for review. The predetermined number may be based on available machine time. The sample selection rule may also be based on user input, such as user selection of a particular area of interest.

In defect review, the possible defects may be analyzed in greater detail than the first defect search. For example, locations of the selected possible defects may be imaged again with higher resolution. Defect review may include performing image analysis on a captured image of the wafer surface using a second set of parameters and/or a second image processing algorithm. Defects can be confirmed and classified accordingly. The image analysis may reveal whether a possible defect is a real defect or not.

A defect probability can be determined based on the results of defect review. For example, possible defects that were grouped together in the same group from the pattern grouping step may be associated with one another. A defect probability for a group can be calculated based on defect rate determined from all of the possible defects in the group. Defect probabilities can be determined for each of the groups.

Determined defect probabilities can be fed back into a pattern library. For example, an entry can be stored in the pattern library that is associated with a particular group and its defect probability. The pattern library can be continually updated with new entries comprising newly discovered types of defects. When a possible defect is identified having a pattern that does not exist in the pattern library, the pattern may be added with an initialized defect probability.

A second defect search may include performing image analysis on a captured image of a wafer surface similar to the first defect search. For example, the second defect search may use the first set of parameters and/or the first image processing algorithm. After identifying possible defects, pattern data can be extracted and pattern grouping can be performed. Next, defect review can be performed on the identified possible defects.

Selection of the possible defects for review may be based on information from the pattern library. For example, the pattern library may be searched for pattern data corresponding to the identified possible defects. If an entry is found for an identified possible defect, the possible defect can be assigned to the corresponding group and defect probability can be loaded. If no entry exists for an identified possible defect, the possible defect can be flagged as a new type of defect. For the new type of defect, defect probability can be assigned based on a default value, for example. Additionally, defect probability can be determined based on the extracted pattern data, such as a degree of complexity of the geometry of the pattern, and other factors. Therefore, even for identified possible defects for which there is no preexisting data of defect rate, high risk patterns can be assigned a defect probability reflective of the possibility of defects. Likewise, low risk patterns can be identified.

Selection of the possible defects for review may be based on defect probability. For example, among all the defects identified in the defect search, priority may be given to those having the highest defect probability and thus only those with the highest defect probability may be selected for reconfirmation and review. Accordingly, possible defects identified in the defect search that have low probability of being real defects may be filtered out on the basis of their pattern data. Thus, it may be possible for nuisance defects to be omitted from defect review, allowing defect review speed to be increased and providing defect detection information that is more informative to a user.

Reference is now made to FIG. 1, which illustrates an exemplary electron beam inspection (EBI) system 100 consistent with embodiments of the present disclosure. EBI system 100 may be used for imaging. As shown in FIG. 1, EBI system 100 includes a main chamber 101 a load/lock chamber 102, an electron beam tool 104, and an equipment front end module (EFEM) 106. Electron beam tool 104 is located within main chamber 101. EFEM 106 includes a first loading port 106*a* and a second loading port 106*b*. EFEM 106 may include additional loading port(s). First loading port 106*a* and second loading port 106*b* receive wafer front opening unified pods (FOUPs) that contain wafers (e.g., semiconductor wafers or wafers made of other material(s)) or samples to be inspected (wafers and samples may be collectively referred to as "wafers" herein). A lot containing a plurality of wafers may be loaded for processing as a batch.

One or more robotic arms (not shown) in EFEM 106 may transport the wafers to load/lock chamber 102. Load/lock chamber 102 is connected to a load/lock vacuum pump system (not shown) which removes gas molecules in load/lock chamber 102 to reach a first pressure below the atmospheric pressure. After reaching the first pressure, one or more robotic arms (not shown) may transport the wafer from load/lock chamber 102 to main chamber 101. Main chamber 101 is connected to a main chamber vacuum pump system (not shown) which removes gas molecules in main chamber 101 to reach a second pressure below the first pressure. After reaching the second pressure, the wafer is subject to inspection by electron beam tool 104. Electron beam tool 104 may be a single-beam system or a multi-beam system. A controller 109 is electronically connected to electron beam tool 104. Controller 109 may be a computer configured to execute various controls of EBI system 100. While controller 109 is shown in FIG. 1 as being outside of the structure that includes main chamber 101, load/lock chamber 102, and EFEM 106, it is appreciated that controller 109 can part of the structure.

Figure 2:
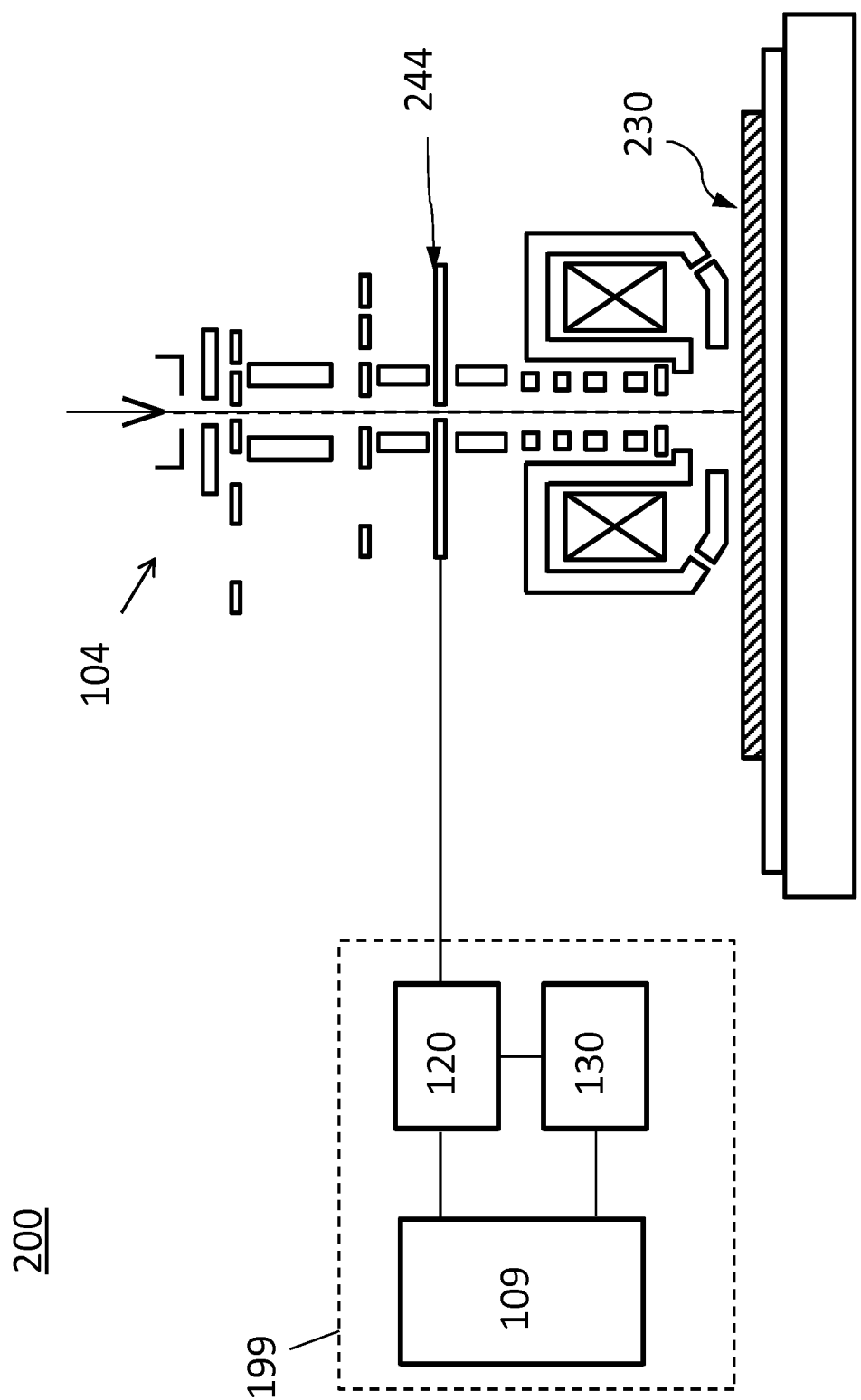
FIG. 2 is a schematic diagram illustrating an exemplary electron beam tool, consistent with embodiments of the present disclosure that can be a part of the exemplary electron beam inspection system of FIG. 1.

FIG. 2 illustrates an imaging system 200 according to embodiments of the present disclosure. Electron beam tool 104 of FIG. 2 may be configured for use in EBI system 100. Electron beam tool 104 may be a single beam apparatus or a multi-beam apparatus.

System 200 may be used for inspecting a wafer 230 on a sample stage, and comprises an electron beam tool 104, as discussed above. System 200 also comprises an image processing system 199 that includes an image acquirer 120, a storage 130, and controller 109. Image acquirer 120 may comprise one or more processors. For example, image acquirer 120 may comprise a computer, server, mainframe host, terminals, personal computer, any kind of mobile computing devices, and the like, or a combination thereof. Image acquirer 120 may connect with a detector 244 of electron beam tool 104 through a medium such as an electrical conductor, optical fiber cable, portable storage media, IR, Bluetooth, internet, wireless network, wireless radio, or a combination thereof. Image acquirer 120 may receive a signal from detector 244 and may construct an image. Image acquirer 120 may thus acquire images of wafer 230. Image acquirer 120 may also perform various post-processing functions, such as generating contours, superimposing indicators on an acquired image, and the like. Image acquirer 120 may be configured to perform adjustments of brightness and contrast, etc. of acquired images. Storage 130 may be a storage medium such as a hard disk, random access memory (RAM), other types of computer readable memory, and the like. Storage 130 may be coupled with image acquirer 120 and may be used for saving scanned raw image data as original images, and post-processed images. Image acquirer 120 and storage 130 may be connected to controller 109. In some embodiments, image acquirer 120, storage 130, and controller 109 may be integrated together as one control unit.

In some embodiments, image acquirer 120 may acquire one or more images of a sample based on an imaging signal received from detector 244. An imaging signal may correspond to a scanning operation for conducting charged particle imaging. An acquired image may be a single image comprising a plurality of imaging areas. The single image may be stored in storage 130. The single image may be an original image that can be divided into a plurality of regions. Each of the regions may comprise one imaging area containing a feature of wafer 230.

Figure 3:
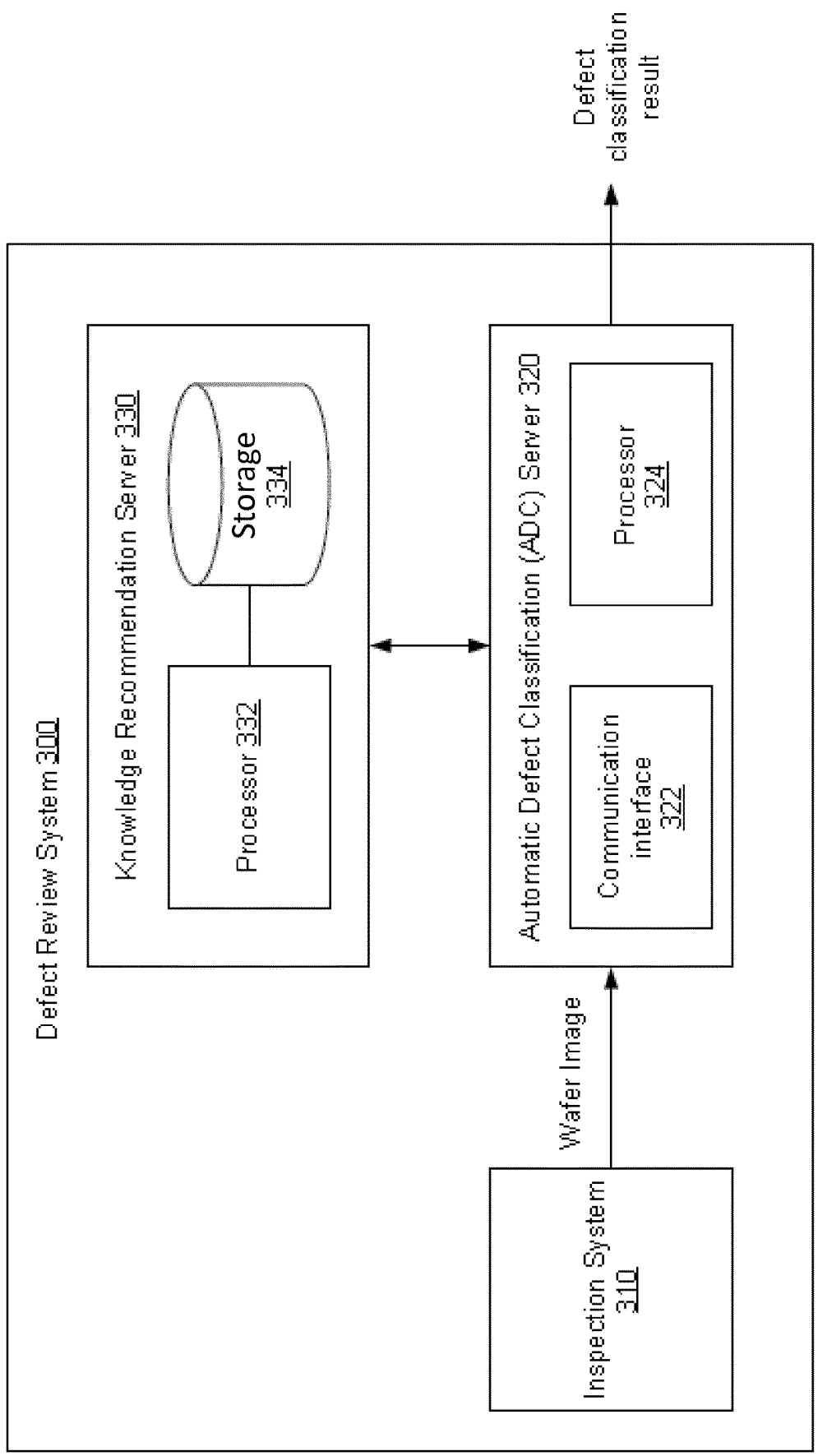
FIG. 3 is a block diagram of an exemplary defect review system, consistent with embodiments of the present disclosure.

In some embodiments, a computer system can be provided that can identify defects on a wafer image and classify the defects into categories according to the defect type. For example, once a wafer image is acquired, it may be transmitted to the computer system for processing. FIG. 3 is a schematic diagram of a defect review system 300, consistent with embodiments of the present disclosure.

Referring to FIG. 3, defect review system 300 may include a wafer inspection system 310, an Automatic Defect Classification (ADC) server 320, and a knowledge recommendation server 330 electrically coupled to the ADC server 320. Wafer inspection system 310 can be EBI system 100 described with respect to FIG. 1. It is appreciated that ADC server 320 and knowledge recommendation server 330 can be part of and/or remote from EBI system 100.

Wafer inspection system 310 can be any inspection system that can generate an inspection image of a wafer. The wafer can be a semiconductor wafer substrate, or a semiconductor wafer substrate having one or more epi-layers and/or process films, for example. Wafer inspection system 310 can be any currently available or developing wafer inspection system. The embodiments of the present disclosure do not limit the specific type for wafer inspection system 310 as long as such a system can generate a wafer image having a resolution high enough to observe key features on the wafer (e.g., less than 20 nm).

ADC server 320 may include a communication interface 322 that is electrically coupled to the wafer inspection system 310 to receive the wafer image. ADC server 320 can also include a processor 324 that is configured to analyze the wafer image, and detect and classify wafer defects that appear on the wafer image by using a defect knowledge file. The defect knowledge file can be manually provided to ADC server 320 by an operator. Alternatively, according to some embodiments of the present disclosure, the defect knowledge file can be automatically provided to ADC server 320 by knowledge recommendation server 330.

For example, knowledge recommendation server 330 may be electrically coupled to the ADC server 320. Knowledge recommendation server 330 may include a processor 332 and a storage 334. Processor 332 may be configured to build a plurality of defect knowledge files, and store the plurality of defect knowledge files in storage 334. The plurality of defect knowledge files may contain information related to various types of defects generated during various stages of wafer manufacturing processes. The various stages of wafer manufacturing processes may include, but are not limited to, a lithography process, an etching process, a chemical mechanical polishing (CMP) process, and an interconnection forming process.

Processor 332 may be configured to build the plurality of defect knowledge files based on a plurality of defect patch images. The plurality of defect patch images can be generated by a wafer inspection tool, such as electron beam tool 104 illustrated in FIG. 2. A defect patch image may be a small image (e.g., 34×34 pixels) of a portion of the wafer that contains a defect. The defect patch image may be centered on the defect, and may include neighboring pixels of the defect.

Processor 332 can be trained, via a machine learning process, to build a knowledge file related to a specific type of defect based on a plurality of defect patch images of that type of defect. For example, processor 332 can be trained to build a knowledge file related to broken line defects generated in an interconnection forming process based on a plurality of defect patch images of broken line defects.

Processor 332 may also be configured to, in response to a request for knowledge recommendation from ADC server 320, search for a knowledge file that matches a wafer image included in the received request, and provide the knowledge file to the ADC server 320.

Storage 334 may store an ADC data center that contains a plurality of defect knowledge files related to various types of defects generated during various stages of wafer manufacturing processes. The plurality of defect knowledge files in the ADC data center may be built by processor 332 of knowledge recommendation server 330. Alternatively, a portion of the defect knowledge files in storage 334 may be preset by a user or an external computer system, and may be preloaded into storage 334.

A defect knowledge file can include general information about a single type of defect. The general information can include patch images and feature parameters to be used for later classification (e.g., size, edge roughness, depth, height, etc.) of the single type of defect. Alternatively, according to some embodiments of the present disclosure, a defect knowledge file can include general information about a plurality of types of defects that are present in the same process layer of a wafer. The single process layer can be, for example, a substrate layer, an epitaxial layer, a thin film layer, a photoresist layer, an oxide layer, a metal interconnection layer, etc.

Figure 4:
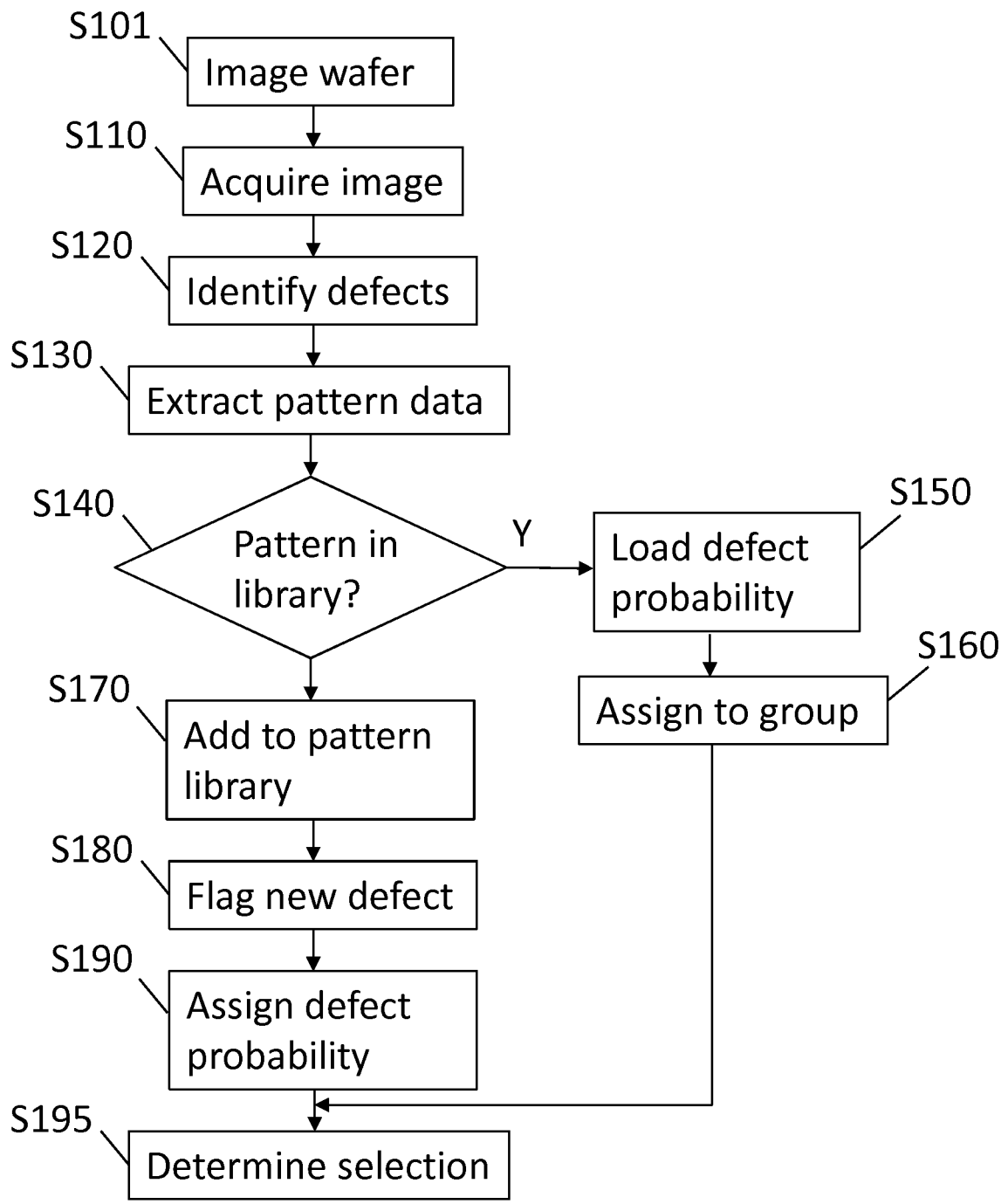
FIG. 4 is a flow chart illustrating an exemplary image processing method consistent with embodiments of the present disclosure.

FIG. 4 is a flow chart illustrating an exemplary image processing method consistent with embodiments of the present disclosure. The image processing method can be performed by one or more processors that may be coupled with a charged particle beam apparatus. For example, controller 109 may include the one or more processors and may be programmed to implement the image processing method. Controller 109 may generate various control signals for controlling operations of a charged particle beam apparatus. Controller 109 may receive and process data from the charged particle beam apparatus. In some embodiments, the image processing method can be performed by processor 324 or processor 332 of defect review system 300.

In step S101, a charged particle beam apparatus may be controlled to image a wafer. Imaging may comprise scanning the wafer to image at least a portion of the wafer. In step S110, one or more scanned raw images of the imaging area may be obtained. The one or more scanned raw images may comprise the entire surface of the wafer. Image acquisition in step S110 may comprise receiving signals from a detector of the charged particle beam apparatus or loading an image from a storage. In a step S120, one or more features on the wafer are identified. The one or more features may comprise possible defects. Step S120 may include wafer mapping. Identification of possible defects may be performed by conducting a defect search. For example, the defect search of step S120 may include performing image analysis on an acquired image of the wafer surface using a first set of parameters and/or using a first image processing algorithm. Identification of possible defects may include determining a location, a group of locations, or a range of locations in x-y coordinates on the wafer surface. The location information may be stored in a wafer map database. Storage 130 may comprise the wafer map database.

In step S130, pattern data can be determined corresponding to the identified possible defects. The pattern data can be extracted from a wafer design plan based on location information gathered in step S120. The wafer design plan may be registered in advance. For example, the wafer design plan may be a graphical representation of the features on the wafer surface. The wafer design plan may be based on a pattern layout for designing the wafer. The wafer design plan may correspond to a mask used to fabricate the wafer. The wafer design plan may be stored in a wafer design database. Storage 130 may comprise the wafer design database. According to the information data from step S120, individual features can be extracted corresponding to the identified possible defects. For example, based on the x-y coordinates of the possible defect locations identified in step S120, pattern data comprising geometry information of original feature designs can be gathered. Each identified possible defect may have a corresponding original feature design.

Pattern data may be extracted by superimposing an outline on a feature in the graphical representation of the wafer design plan. Pattern data may also be provided in a native format of the wafer design plan. For example, pattern data may be directly extracted from the graphical representation of wafer design plan as a portion of the wafer design plan.

In determination step S140, it is determined whether the pattern data for an identified possible defect exists in a pattern library. Storage 130 or storage 334 may comprise the pattern library. The method may search the pattern library for matching patterns based on a degree of correspondence. For example, patterns may be determined to match if a feature design outline has a degree of similarity of 90% or more with another pattern in the pattern library. The patterns in the pattern library may comprise prior extracted patterns, standard patterns (such as patterns of standard IC features), and the like.

If a matching pattern is found, the method may proceed to step S150. In step S150, a defect probability is loaded from the pattern library. The pattern library may comprise individual entries having pattern data, defect probability, pattern group, and other information associated therewith. The defect probability may be based on prior calculated results, saved data, simulations, standard values (such as industry standard rates for standard IC features), and the like. The loaded defect probability may be assigned to the identified possible defect.

Following step S150, the method may proceed to step S160. In step S160, the identified possible defect may be assigned to a group. Grouping assignment may be based on the pattern data. For example, identified possible defects having pattern data similar to others in a group may be added to the group. The group may have a common defect probability.

If no matching pattern is found in determination step S140, the method may proceed to step S170. For example, if a feature design outline of the identified possible defect does not have a degree of similarity of 90% or more with any other pattern in the pattern library, it may be determined that there is no matching pattern and the identified possible defect is a new defect pattern. In some embodiments, a threshold value other than 90% can be used. In step S170, the pattern data of the identified possible defect may be added to the pattern library. In step S180, the possible defect can be flagged as a new type of defect. In step S190, a defect probability can be assigned to the identified possible defect. Defect probability can be based on, for example, an initialized value, a default value or can be determined based on the extracted pattern data, such as a degree of complexity of the geometry of the pattern, and other factors.

Step S130 may be repeated for each possible defect identified in step S120. In some embodiments, a wafer may be processed that has, for example, 200,000 or more total identified possible defects. Thus, steps S120 though S190 may be carried out for each of the identified possible defects.

In step S195, one or more of the identified possible defects may be selected for second image analysis. Selection may be based on a selection rule. The selection rule may be applied to determine which identified possible defects among the total identified possible defects shall be used for the second image analysis.

The selection rule may be based on defect probability of the identified possible defects. For example, the identified possible defects may be sorted according to defect probability, and those having the highest defect probability may be selected for second image processing. The selection rule may also be based on a predetermined number. The predetermined number may be a maximum number of searchable defects. For example, a maximum number of searchable defects may be limited by available machine time, a user's schedule, and the like. In some embodiments, a user may specify a defect review time of, for example, one hour. Accordingly, the maximum number of searchable defects may be set as the number of defects that can be reviewed in one hour. Thus, the selection of identified possible defects for second image processing may be the maximum number of searchable defects comprising those having the top defect probability.

In some embodiments, the selection may comprise any identified possible defects having a defect probability greater than a predetermined threshold. For example, if machine time is unlimited, and a user desires to review all identified possible defects that have a high likelihood of being real defects, the selection rule can be set accordingly.

Step S195 may also include selecting which of a plurality of selection rules to apply. For example, if a number of the identified possible defects that are flagged as new is greater than a first threshold value, it may be determined that a random sampling selection rule shall be applied. A determination may be made based on a ratio of the identified possible defects flagged as new to the total number of identified possible defects. In some embodiments, it may be determined that the pattern library data is insufficient for providing a meaningful basis for selection criteria based on recorded defect probability. Alternatively, in some embodiments, prior saved defect probability based on actual defect review is not necessarily needed, and a simulated defect probability can be used. The simulated defect probability may be based on a degree of complexity of pattern data extracted for the identified possible defects. For example, a pattern feature having a shape outline with a large number of sides and a large number of vertexes may have a high simulated defect probability. A pattern feature having a shape outline with lines spaced apart from one another less than a certain distance may have a high simulated defect probability. Various criteria can be applied. Furthermore, a pattern can be flagged by a user as important, and the corresponding defect probability can be set to be high.

Figure 5:
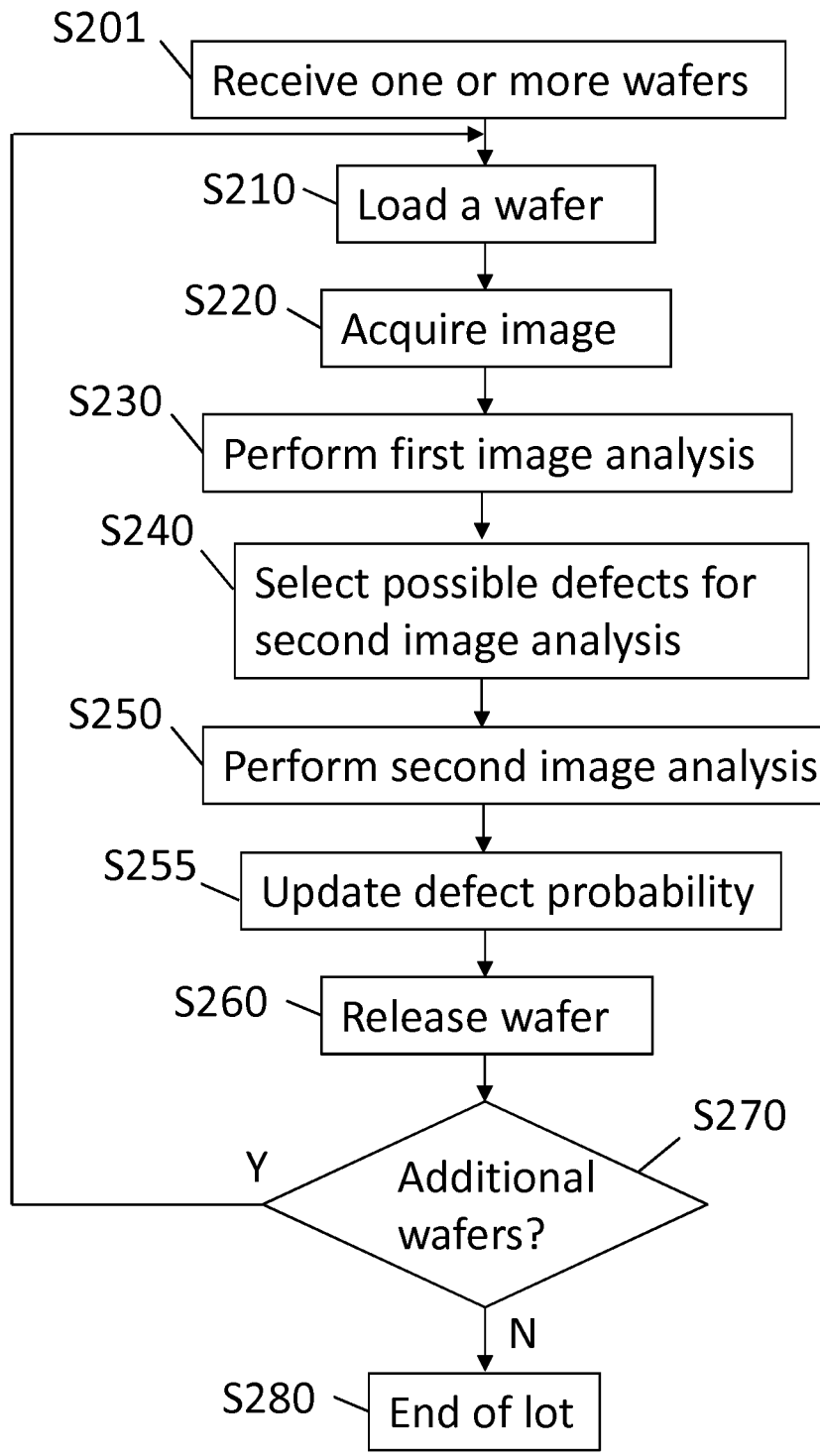
FIG. 5 is a flow chart illustrating an exemplary defect detection method consistent with embodiments of the present disclosure.

FIG. 5 is a flow chart illustrating an exemplary defect detection method consistent with embodiments of the present disclosure. The defect detection method can be performed by one or more processors coupled with a charged particle beam apparatus. For example, controller 109 may be programmed to implement the defect detection method with EBI system 100. Processor 324 or 332 may also be configured to implement defect detection method.

In step S201, one or more wafers are received. For example, a lot comprising several wafers in a wafer cassette, or more than one cassette, can be received in a loading port of a charged particle beam system. In step S210, a wafer is loaded. For example, a wafer may be placed on a sample stage and prepared for imaging.

In step S220, an image of the wafer is acquired. The image may be a scanned raw image. In step S230, first image analysis is performed. Step S230 may include performing image analysis on the acquired image of the wafer surface using a first set of parameters and/or using a first image processing algorithm. Step S230 may also include identifying possible defects and the like such as by steps S120 to S190 as discussed above with respect to FIG. 4.

In step S240, a selection is made of identified possible defects that shall be analyzed by second image analysis. The selection may be performed by a selection rule. In step S250, second image analysis is performed. The second image analysis may include performing image analysis on the acquired image of the wafer surface using a second set of parameters different from the first set of parameters, and/or using a second image processing algorithm different from the first image processing algorithm. The second set of parameters and/or the second image processing algorithm may be more detailed than the first set of parameters and/or the first image processing algorithm, respectively. The second image analysis may include acquiring a new image of the wafer. For example, the second image analysis may include imaging the locations of the identified possible defects selected for second image analysis in greater detail than the first image analysis. The second image analysis may verify the identified possible defects as being real defects or not.

The second image analysis may include defect review. In defect review, the identified possible defects may be classified, as shall be discussed below. Furthermore, defects may be assigned a level of defectiveness. For example, a defect can be categorized as safe, uncertain, weak, and killer. Although a structure on the wafer may have a defect, the defect may not interfere with the function it should perform in the IC device. Thus, such a defect may be categorized as safe. On the other hand, if a defect is so extreme that the IC device may be compromised, the defect can be categorized as killer.

According to a result of the second image analysis, a detect probability can be determined. In step S255, defect probability for the identified possible defect can be updated. If the identified possible defect is confirmed as a real defect through the second image analysis, a predetermined number may be assigned as its defect probability. The updating may comprise overwriting a value of defect probability previously associated with the identified possible defect. The updating may comprise writing an initial value of defect probability for the identified possible defect.

A value of the defect probability may be based on a level of defectiveness determined as a result of the second image analysis. For example, the numerical value of defect probability for a "killer" defect may be greater than that for a "safe" defect.

If the identified possible defect is confirmed as a nuisance defect, its defect probability may be zero. For example, in the first image analysis, a low resolution image may be used.

However, as the dimensions of IC features become smaller, such a low resolution image may be insufficient for properly identifying the presence or absence of defects. Identification of some structures as being possible defects may be due to an image being out of focus because a feature may be out of the imaging tool's focal plane, for example. Thus, upon performing imaging using a second image analysis, for example in higher resolution and with more accurate focus, it may be determined that the structure is not actually defective.

While the designation "nuisance defect" has been used herein, the disclosure is not necessarily limited thereto. For example, defects that are real defects but have such a small defect probability as to be negligible may be similarly disregarded in selection for second image analysis. A predetermined threshold value of defect probability may be used accordingly.

Step S255 may include determining defect probability for a group. For example, the identified possible defect may be assigned to a group based on its pattern data. Accordingly, results of the instant second image analysis and defect probability determination can be used to determine a group defect probability. Group defect probability may be based on an average. Group defect probability may be based on a weighted average where more recent data is given more weight. Group defect probability may be based on an average where a predetermined number of the most recent defect probability determinations are used while others are discarded.

Group defect probability may be calculated as a ratio of the number of defects confirmed by the second image analysis to the total number of identified possible defects found on a wafer. For example, in some embodiments, regardless of whether a defect is categorized as safe, uncertain, weak, killer, etc., if a real defect exists, the defect is counted. Group defect probability may be calculated on a per wafer basis. Group defect probability may be calculated by averaging across one or more wafers. Group defect probability may also be based on a lot.

Defects may include various types of defects, for example, those discussed as follows. Some common types of defects incurred in lithographic processes may include photoresist (PR) residue defects due to PR deterioration or impurity, peeling defects, bridge defects, bubble defects, and dummy pattern missing defects due to pattern shift. Defects incurred in etching processes may include etching residue defects, over-etching defects, and open circuit defects. Defects incurred in chemical mechanical planarization (CMP) processes may include slurry residue defects, dishing defects, and erosion defects due to variant polishing rates, scratches due to polishing, etc. Further, when process nodes continue shrinking, new materials and processes will be introduced that may incur new types of defects. For example, because physical dimensions of patterns may be smaller than the optical resolution of the applied lithographic wavelength (e.g., 193 nm), the critical dimension exposed on wafers may incur offset. Thinning defects are another type of defect inevitably incurred in process node shrinking. In order to reduce RC delay in multi-layered interconnection structures, low-k dielectric layers and copper materials may be introduced. Since etching may not be ideal when using copper, a damascene process may be used in which metal is filled into a dielectric layer. Therefore, some other hidden defects may be covered under layers, such as void defects, etching residue defects, over-etching defects, under layer particles, and via open incurred in the interconnection process.

Further still, other types of semiconductor processes may incur additional types of defects. For example, some other processing techniques used in the semiconductor industry may include physical vapor deposition (PVD), chemical vapor deposition (CVD), electrochemical deposition (EPC), molecular beam epitaxy (MBE), atomic layer deposition (ALD), and others. Other techniques, such as those used in patterning, removal, and modification of electrical properties (e.g., doping), may also incur additional types of defects.

Defect review may include classifying defects according to their type.

Defects of a certain type that would compromise the function of the intended structure may be further categorized based on the type of defect. For example, for a line pattern structure, a defect may be classified as a thinning defect, and thus there may be a chance the structure would be unable to perform an intended function of signal conveying. If a trace becomes too thin, it may be unable to handle the electrical load intended to pass through it according to design specifications. Further, if a pattern thins down so much that a disconnect defect occurs, the structure would be completely incapable of conveying signals. Thus, according to the defect classification, a corresponding category of safe, uncertain, weak, killer, etc. can be assigned.

Defects may comprise systematic defects and non-systematic defects. Systematic defects may be found repeatedly and systematically in wafers in such a manner that defect patterns can be used as a reference in classification to determine root causes of, for example, which process incurs such defects. More specifically, systematic defects can be classified as reticle errors in alignment or machine offset, process mistakes incurred by recipes or materials, prober damages in wafer probing, scratches on wafer surface, and wafer edge effect of topography incurred from non-uniformity of PR coating or thermal stress.

Non-systematic defects may include random particle defects, such as random residues left in wafers. Distributions and characteristic profiles can be useful references to distinguish systematic defects from non-systematic defects. Non-systematic defects, such as random particle defects incurred from particles in air randomly fallen on the wafer, may not be easily identified and resolved. However, identification and classification of such defects can be informative.

Defect classification may also include determining if the defect is systematic or non-systematic. Classification and detailed review may be important for various applications. For example, in some instances, it may be desirable to distinguish systematic defects and random defects.

Defects may have various types of structures and characteristics. However, precursor patterns may have a standard pattern geometry. For example, the same type of precursor pattern may be associated with different types of defects, and vice versa.

Determination of defect probability may be based on defect classification.

Continuing in the flow chart of FIG. 5, the method may proceed to step S260. In step S260, the wafer may be released from the tool so that a new wafer can be loaded. In a determination step S270, it is determined whether there are further wafers for processing. For example, the method may request the next wafer in a lot to be imaged and analyzed, and when there are no more wafers left to be inspected, the processing of the lot may finish, as in step S280.

In some embodiments, image analysis can be performed on structures on the wafer based on pattern data. For example, selective inspection may be employed. In selective inspection, a wafer design plan may be analyzed prior to actual inspection of the wafer. A wafer inspection plan may be determined based on pattern data available from the pattern library. In some embodiments, the pattern library may be searched to determine which patterns have the highest defect probability. According to a result of a pattern library search, the wafer inspection plan may be built so that priority is given to locations of the wafer comprising the patterns having the highest defect probability. The data in the pattern library may be based on prior defect detection runs of other wafers. The other wafers may be other wafers in a lot containing the wafer to be inspected. In some embodiments, the data in the pattern library may be based on some other training data, for example.

Using selective inspection, the first image analysis and the second image analysis may be performed based on data in the pattern library. Selective inspection may be helpful to further increase throughput.

Figure 6:
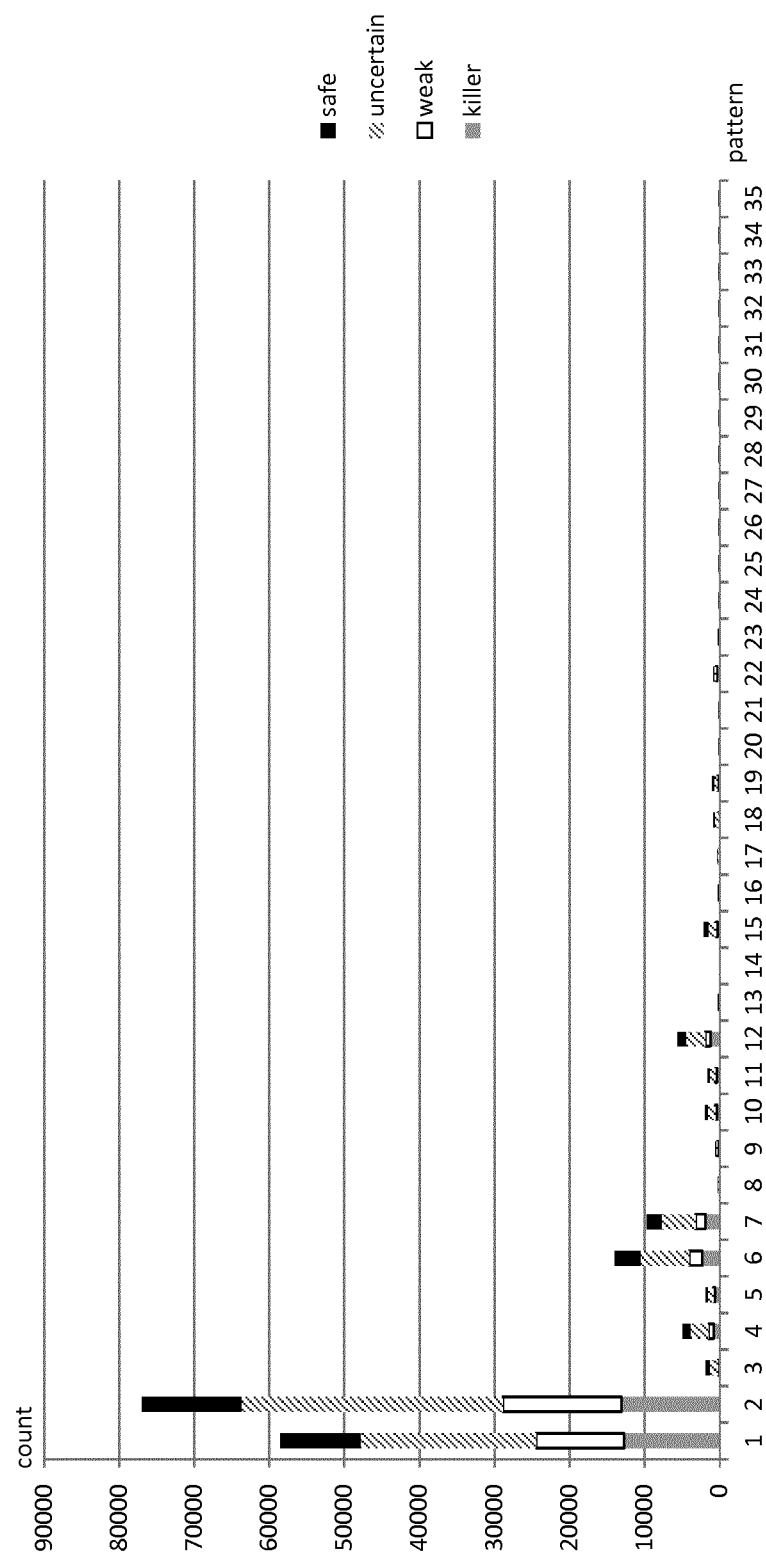
FIG. 6 is a chart showing determined defect count for a wafer consistent with embodiments of the present disclosure

FIG. 6 illustrates a chart showing determined defect count for a wafer consistent with embodiments of the present disclosure. Defect probability information for identified possible defects can be represented graphically in a chart, for example. In some embodiments, defect probability can be based on a count of defects confirmed by second image analysis, such as by defect review. Defect count can be subdivided into defects organized by various criteria. For example, defects may be categorized as safe, uncertain, weak, killer, etc.

Figure 7:
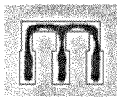
FIG. 7 is a table showing exemplary entries in a pattern library consistent with embodiments of the present disclosure.
Figure 7:
Figure 7:
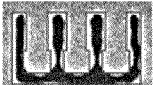
Figure 7:
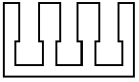
Figure 7:
Figure 7:
Figure 7:
Figure 7:
Figure 7:
Figure 7:
Figure 7:
Figure 7:
Figure 7:
Figure 7:
Figure 7:
Figure 7:
Figure 7:
Figure 7:
Figure 7:
Figure 7:
Figure 7:
Figure 7:
Figure 7:
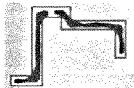
Figure 7:
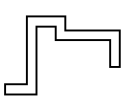

As shown in FIG. 6, counts may be associated with pattern groups on the basis of pattern data. For example, pattern 1 may represent defects having pattern data of a particular geometry. Pattern 1 may be associated with a group of identified possible defects having pattern data that match one another. As shown in FIG. 7, pattern 1 may be associated with a three-terminal semiconductor pattern.

FIG. 7 illustrates a table showing exemplary entries in a pattern library consistent with embodiments of the present disclosure. In some embodiments, group label, as shown in FIG. 7, may correspond to pattern number shown in the horizontal axis of FIG. 6, and may correspond to a pattern group. Defect probability information may include representations such as symbols A, B, C, and so on, as shown. Symbols A, B, C, and so on, may be a representation of defect probability, such as a numerical value.

Patterns 8, 14, 20, 21, as shown in FIG. 6 and FIG. 7, among others, may be considered nuisance defects due to their low real defect count. Defect count of nuisance defects may be, for example, zero.

Results from second image analysis, such as defect review, may be used to continually update the pattern library. Feedback control may be used to continually add entries to the pattern library and update defect probability information as wafers continue to be processed.

While a controller, storage, and one or more circuits are discussed above in some embodiments as separate units, a computer may carry out the processing of all such units.

Figure 8:
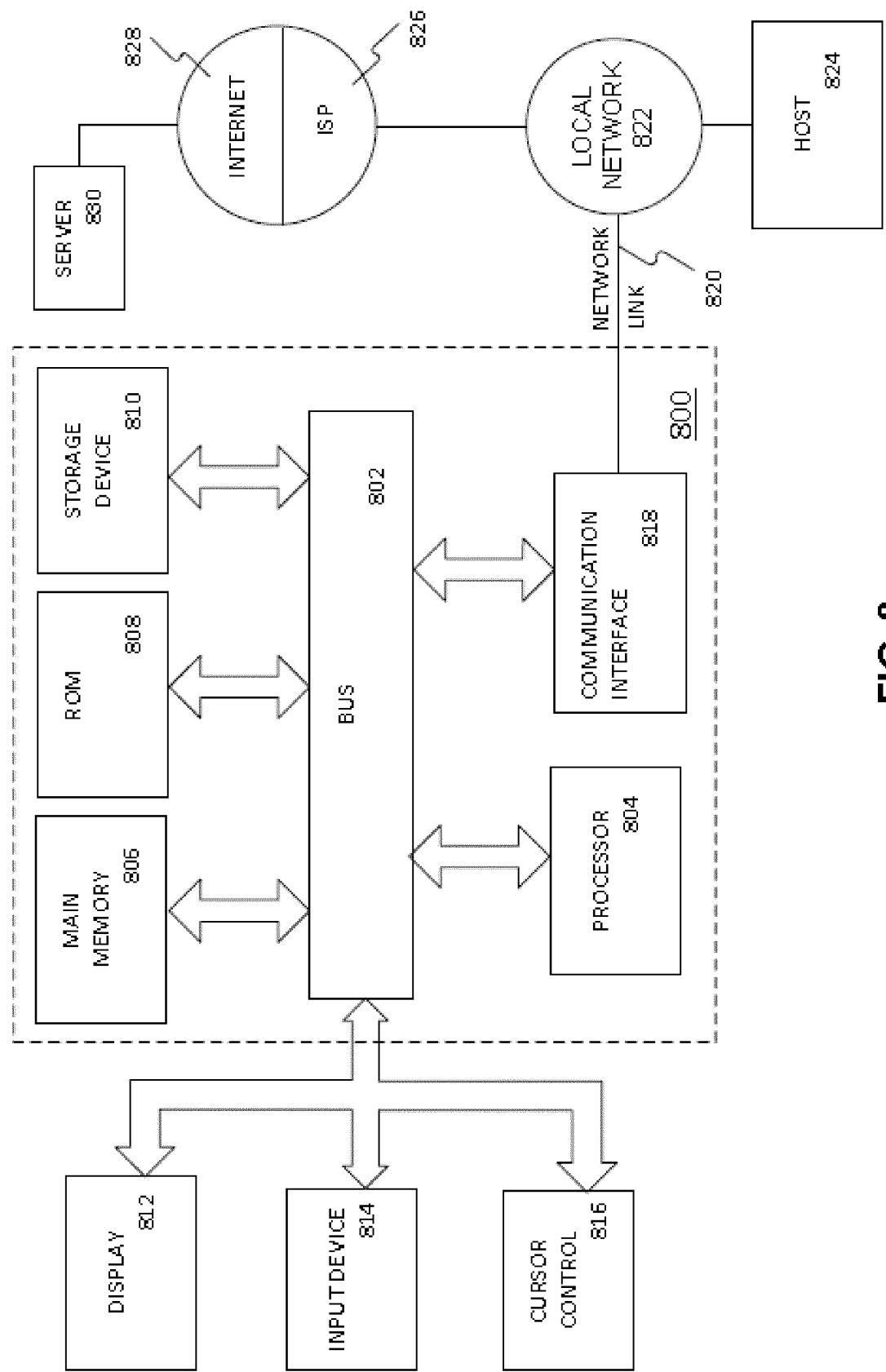
FIG. 8 is a block diagram of an exemplary computer system on which embodiments described herein can be implemented.

For example, a computer system may be provided. FIG. 8 is a block diagram of an exemplary computer system 800 with which embodiments described herein can be implemented. One or more of the knowledge recommendation server, the defect classification server, and the image processing system as described above can be implemented with computer system 800.

Computer system 800 includes a bus 802 or other communication mechanism for communicating information, and one or more hardware processors 804 (denoted as processor 804 for purposes of simplicity; e.g., processor of controller 109 of FIG. 2, or processor 332 of knowledge recommendation server 330 or processor 324 of defect classification server 320 of FIG. 3) coupled with bus 802 for processing information. Hardware processor 804 can be, for example, one or more microprocessors.

Computer system 800 also includes a main memory 806, such as a random access memory (RAM) or other dynamic storage device, coupled to bus 802 for storing information and instructions to be executed by processor 804. Main memory 806 also can be used for storing temporary variables or other intermediate information during execution of instructions to be executed by processor 804. Such instructions, after being stored in non-transitory storage media accessible to processor 804, render computer system 800 into a special-purpose machine that is customized to perform the operations specified in the instructions.

Computer system 800 further includes a read only memory (ROM) 808 or other static storage device coupled to bus 802 for storing static information and instructions for processor 804. A storage device 810 (e.g., storage 130 of FIG. 2, or storage 334 of knowledge recommendation server 330 of FIG. 3), such as a magnetic disk, optical disk, or USB thumb drive (Flash drive), etc., can be provided and coupled to bus 802 for storing information and instructions.

Computer system 800 can be coupled via bus 802 to a display 812, such as a cathode ray tube (CRT), an liquid crystal display (LCD), or a touch screen, for displaying information to a computer user. An input device 814, including alphanumeric and other keys, may be coupled to bus 802 for communicating information and command selections to processor 804. Another type of user input device may be cursor control 816, such as a mouse, a trackball, or cursor direction keys for communicating direction information and command selections to processor 804 and for controlling cursor movement on display 812. The input device may have two degrees of freedom in two axes, a first axis (for example, x) and a second axis (for example, y), that allows the device to specify positions in a plane. In some embodiments, the same direction information and command selections as cursor control may be implemented via receiving touches on a touch screen without a cursor.

Computer system 800 can include a user interface module to implement a graphical user interface (GUI) that can be stored in a mass storage device as executable software codes that are executed by the one or more computing devices. This and other modules can include, by way of example, components, such as software components, object-oriented software components, class components and task components, processes, functions, fields, procedures, subroutines, segments of program code, drivers, firmware, microcode, circuitry, data, databases, data structures, tables, arrays, and variables. The modules may include, for example, one or more components of system 300 illustrated in FIG. 3.

Computer system 800 can implement the techniques described herein using customized hard-wired logic, one or more ASICs or FPGAs, firmware and/or program logic which in combination with the computer system causes or programs computer system 800 to be a special-purpose machine. According to some embodiments, the operations, functionalities, and techniques and other features described herein are performed by computer system 800 in response to processor 804 executing one or more sequences of one or more instructions contained in main memory 806. Such instructions can be read into main memory 806 from another storage medium, such as storage device 810. Execution of the sequences of instructions contained in main memory 806 may cause processor 804 to perform method steps (e.g., the process as shown in FIG. 4, or the process as shown in FIG. 5) described herein. In alternative embodiments, hard-wired circuitry can be used in place of or in combination with software instructions.

A non-transitory computer readable medium may be provided that stores instructions for a processor (for example, a processor of controller 109) to carry out image processing, data processing, database management, graphical display, operations of a charged particle beam apparatus, or other imaging device, etc. Common forms of non-transitory media include, for example, a floppy disk, a flexible disk, hard disk, solid state drive, magnetic tape, or any other magnetic data storage medium, a CD-ROM, any other optical data storage medium, any physical medium with patterns of holes, a RAM, a PROM, and EPROM, a FLASH-EPROM or any other flash memory, NVRAM, a cache, a register, any other memory chip or cartridge, and networked versions of the same.

Non-transitory media is distinct from, but can be used in conjunction with, transmission media. Transmission media can participate in transferring information between storage media. For example, transmission media can include coaxial cables, copper wire and fiber optics, including the wires that comprise bus 802. Transmission media can also take the form of acoustic or light waves, such as those generated during radio-wave and infra-red data communications.

Various forms of media can be involved in carrying one or more sequences of one or more instructions to processor 804 for execution. For example, the instructions can initially be carried on a magnetic disk or solid state drive of a remote computer. The remote computer can load the instructions into its dynamic memory and send the instructions over a telephone line using a modem. A modem local to computer system 800 can receive the data on the telephone line and use an infra-red transmitter to convert the data to an infra-red signal. An infra-red detector can receive the data carried in the infra-red signal and appropriate circuitry can place the data on bus 802. Bus 802 carries the data to main memory 806, from which processor 804 retrieves and executes the instructions. The instructions received by main memory 806 can optionally be stored on storage device 810 either before or after execution by processor 804.

Computer system 800 can also include a communication interface 818 coupled to bus 802. Communication interface 818 (e.g., communication interface 322 of defect classification server 320 of FIG. 3 or any communication interface (not shown) of knowledge recommendation server 330) can provide a two-way data communication coupling to a network link 820 that can be connected to a local network 822. For example, communication interface 818 can be an integrated services digital network (ISDN) card, cable modem, satellite modem, or a modem to provide a data communication connection to a corresponding type of telephone line. As another example, communication interface 818 can be a local area network (LAN) card to provide a data communication connection to a compatible LAN. Wireless links can also be implemented. In any such implementation, communication interface 818 can send and receive electrical, electromagnetic or optical signals that carry digital data streams representing various types of information.

Network link 820 can typically provide data communication through one or more networks to other data devices. For example, network link 820 can provide a connection through local network 822 to a host computer 824 or to data equipment operated by an Internet Service Provider (ISP) 826. ISP 826 in turn can provide data communication services through the world wide packet data communication network now commonly referred to as the "Internet" 828. Local network 822 and Internet 828 both use electrical, electromagnetic or optical signals that carry digital data streams. The signals through the various networks and the signals on network link 820 and through communication interface 818, which carry the digital data to and from computer system 800, can be example forms of transmission media.

Computer system 800 can send messages and receive data, including program code, through the network(s), network link 820 and communication interface 818. In the Internet example, a server 830 can transmit a requested code for an application program through Internet 828, ISP 826, local network 822 and communication interface 818.

The received code can be executed by processor 804 as it is received, and/or stored in storage device 810, or other non-volatile storage for later execution. In some embodiments, server 830 can provide information for being displayed on a display.

The embodiments may further be described using the following clauses:

1. A method of performing image processing, comprising:
acquiring one or more images of a sample;
identifying a plurality of first features in the one or more images using first image analysis; determining pattern data corresponding to the plurality of first features;
selecting at least one of the plurality of first features based on the pattern data; and
performing second image analysis of the least one of the plurality of first features.

2. The method of clause 1, further comprising:
determining a defect probability of each of the plurality of first features based on the pattern data,
wherein selecting the at least one of the plurality of first features is based on the defect probability.

3. The method of any of clauses 1 to 2, wherein the first image analysis comprises acquiring an image of the sample using a first set of parameters or using a first image processing algorithm, and the second image analysis comprises acquiring an image of the sample using a second set of parameters or using a second image processing algorithm.

4. The method of any of clauses 1 to 3, wherein the first image analysis comprises defect inspection and the second image analysis comprises defect review.

5. The method of any of clauses 1 to 4, wherein the pattern data comprises a design plan of the sample.

6. The method of clause 5, wherein determining the pattern data comprises extracting patterns from the design plan of the sample based on a location of the first features determined in the first image analysis.

7. The method of any of clauses 1 to 6, further comprising:
grouping a first number of the first features in a first group based on the pattern data; and
determining a first defect probability of the first group based on defect probability of other members of the first group, wherein the defect probability is based on results of defect review of the other members of the first group, and wherein selecting the at least one of the plurality of first features is based on the first defect probability.

8. The method of any of clauses 1 to 7, further comprising:
searching a pattern library; and
determining a match of at the least one of the plurality of first features with an entry in the pattern library based on the pattern data, wherein selecting the at least one of the plurality of first features is based on information of the entry in the pattern library.

9. The method of clauses 1 to 7, further comprising:
adding the pattern data to a pattern library corresponding to the at least one of the plurality of first features.

10. A method of inspecting a sample, comprising:
performing first imaging of at least a portion of the sample to acquire a first image of the sample;
identifying a plurality of first features in the first image;
determining pattern data corresponding to the plurality of first features;
selecting at least one of the plurality of first features based on the pattern data; and
performing second imaging of the sample at locations corresponding to the plurality of first features.

11. The method of clause 10, further comprising:
determining a defect probability of each of the plurality of first features based on the pattern data,
wherein selecting the at least one of the plurality of first features is based on the defect probability.

12. The method of any of clause 10 to 11, wherein the first imaging comprises acquiring an image of the sample using a first set of parameters or using a first image processing algorithm, and the second imaging comprises acquiring an image of the sample using a second set of parameters or using a second image processing algorithm.

13. The method of any of clauses 10 to 12, wherein the first imaging comprises defect inspection and the second imaging comprises defect review.

14. The method of any of clause 10 to 13, wherein the pattern data comprises a design plan of the sample.

15. The method of clause 14, wherein determining the pattern data comprises extracting patterns from the design plan of the sample based on a location of the first features determined in the identifying.

16. The method of any of clauses 10 to 15, further comprising:
grouping a first number of the first features in a first group based on the pattern data; and
determining a first defect probability of the first group based on defect probability of other members of the first group, wherein the defect probability is based on results of defect review of the other members of the first group, and wherein selecting the at least one of the plurality of first features is based on the first defect probability.

17. The method of any of clauses 10 to 16, further comprising:
searching a pattern library; and
determining a match of at the least one of the plurality of first features with an entry in the pattern library based on the pattern data, wherein selecting the at least one of the plurality of first features is based on information of the entry in the pattern library.

18. The method of any of clauses 10 to 16, further comprising:
adding the pattern data to a pattern library corresponding to the at least one of the plurality of first features.

19. The method of any of clauses 10 to 18, further comprising:
inspecting a first sample and a second sample;
determining a defect probability of one or more features of the first sample based on second imaging of the first sample;
selecting one or more features of the second sample based on the defect probability of the one or more features of the first sample; and
performing second imaging of the second sample at locations corresponding to the one or more features of the second sample.

20. A non-transitory computer readable medium that stores a set of instructions that is executable by at least one processor of an apparatus to cause the apparatus to perform a method comprising:
performing first imaging of at least a portion of a sample to acquire a first image of the sample;
identifying a plurality of first features in the first image;
determining pattern data corresponding to the plurality of first features;
selecting at least one of the plurality of first features based on the pattern data; and
performing second imaging of the sample at locations corresponding to the plurality of first features 21. The computer readable medium of clause 20, wherein the set of instructions further cause the apparatus to perform:
determining a defect probability of each of the plurality of first features based on the pattern data,
wherein selecting the at least one of the plurality of first features is based on the defect probability.

22. The computer readable medium of any of clauses 20 to 21, wherein the first imaging comprises acquiring an image of the sample using a first set of parameters or using a first image processing algorithm, and the second imaging comprises acquiring an image of the sample using a second set of parameters or using a second image processing algorithm.

23. The computer readable medium of any of clauses 20 to 22, wherein the first imaging comprises defect inspection and the second imaging comprises defect review.

24. The computer readable medium of any of clauses 20 to 23, wherein the pattern data comprises a design plan of the sample.

25. The computer readable medium of clause 24, wherein determining the pattern data comprises extracting patterns from the design plan of the sample based on a location of the first features determined in the identifying.

26. The computer readable medium of any of clauses 20 to 25, wherein the set of instructions further cause the apparatus to perform:
grouping a first number of the first features in a first group based on the pattern data; and
determining a first defect probability of the first group based on defect probability of other members of the first group, wherein the defect probability is based on results of defect review of the other members of the first group, and wherein selecting the at least one of the plurality of first features is based on the first defect probability.

27. The computer readable medium of any of clauses 20 to 26, wherein the set of instructions further cause the apparatus to perform:
searching a pattern library; and
determining a match of at the least one of the plurality of first features with an entry in the pattern library based on the pattern data, wherein selecting the at least one of the plurality of first features is based on information of the entry in the pattern library.

28. The computer readable medium of any of clauses 20 to 26, wherein the set of instructions further cause the apparatus to perform:
adding the pattern data to a pattern library corresponding to the at least one of the plurality of first features.

29. The computer readable medium of clause 20, wherein the set of instructions further cause the apparatus to perform:

inspecting a first sample and a second sample;
determining a defect probability of one or more features of the first sample based on second imaging of the first sample;
selecting one or more features of the second sample based on the defect probability of the one or more features of the first sample; and
performing second imaging of the second sample at locations corresponding to the one or more features of the second sample.

30. The computer readable medium of any of clause 20 to 29, wherein the apparatus is a charged particle beam apparatus configured to generate a charged particle beam.

The block diagrams in the figures illustrate the architecture, functionality, and operation of possible implementations of systems, methods, and computer hardware/software products according to various exemplary embodiments of the present disclosure. In this regard, each block in a flowchart or block diagram may represent a module, segment, or portion of code which comprises one or more executable instructions for implementing the specified logical functions. It should be understood that in some alternative implementations, functions indicated in a block may occur out of the order noted in the figures. For example, two blocks shown in succession may be executed or implemented substantially concurrently, or two blocks may sometimes be executed in reverse order, depending upon the functionality involved. Some blocks can also be omitted. It should also be understood that each block of the block diagrams, and combination of the blocks, can be implemented by special purpose hardware-based systems that perform the specified functions or acts, or by combinations of special purpose hardware and computer instructions.

It will be appreciated that the present invention is not limited to the exact construction that has been described above and illustrated in the accompanying drawings, and that various modifications and changes can be made without departing from the scope thereof.

The invention claimed is:

1. A method of performing image processing, comprising:
acquiring one or more images of a sample;
identifying a plurality of first features in the one or more images using first image analysis;
determining pattern data corresponding to the plurality of first features;
selecting at least one of the plurality of first features based on the pattern data, comprising:
grouping a first number of the first features in a first group based on the pattern data;
determining a first defect probability of the first group based on defect probability of other members of the first group, wherein the defect probability is based on results of defect review of the other members of the first group; and
selecting the at least one of the plurality of first features based on the first defect probability; and
performing second image analysis of the least one of the plurality of first features.

2. The method of claim 1, wherein the first image analysis comprises acquiring an image of the sample using a first set of parameters or using a first image processing algorithm, and the second image analysis comprises acquiring an image of the sample using a second set of parameters or using a second image processing algorithm.

3. The method of claim 1, wherein the first image analysis comprises defect inspection and the second image analysis comprises defect review.

4. The method of claim 1, wherein the pattern data comprises a design plan of the sample.

5. The method of claim 4, wherein determining the pattern data comprises extracting patterns from the design plan of the sample based on a location of the first features determined in the first image analysis.

6. The method of claim 1, further comprising:
searching a pattern library; and
determining a match of at the least one of the plurality of first features with an entry in the pattern library based on the pattern data, wherein selecting the at least one of the plurality of first features is further based on information of the entry in the pattern library.

7. The method of claim 1, further comprising:
adding the pattern data to a pattern library corresponding to the at least one of the plurality of first features.

8. A non-transitory computer readable medium that stores a set of instructions that is executable by at least one processor of an apparatus to cause the apparatus to perform a method comprising:
performing first imaging of at least a portion of a sample to acquire a first image of the sample;
identifying a plurality of first features in the first image;
determining pattern data corresponding to the plurality of first features;
selecting at least one of the plurality of first features based on the pattern data, comprising:
grouping a first number of the first features in a first group based on the Pattern data;
determining a first defect probability of the first group based on defect probability of other members of the first group, wherein the defect probability is based on results of defect review of the other members of the first group; and
selecting the at least one of the plurality of first features based on the first defect probability; and
performing second imaging of the sample at locations corresponding to the plurality of first features.

9. The computer readable medium of claim 8, wherein the first imaging comprises acquiring an image of the sample using a first set of parameters or using a first image processing algorithm, and the second imaging comprises acquiring an image of the sample using a second set of parameters or using a second image processing algorithm.

10. The computer readable medium of claim 8, wherein the first imaging comprises defect inspection and the second imaging comprises defect review.

11. The computer readable medium of claim 8, wherein the pattern data comprises a design plan of the sample.

12. The computer readable medium of claim 11, wherein determining the pattern data comprises extracting patterns from the design plan of the sample based on a location of the first features determined in the identifying.

* * * * *